United States Patent
Jun

(10) Patent No.: US 8,018,149 B2
(45) Date of Patent: Sep. 13, 2011

(54) LIGHT-EMITTING APPARATUS INCLUDING OPTICAL RESONANCE STRUCTURE AND ELECTRONIC APPARATUS

(75) Inventor: Qian Jun, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 286 days.

(21) Appl. No.: 12/349,171

(22) Filed: Jan. 6, 2009

(65) Prior Publication Data

US 2009/0179563 A1    Jul. 16, 2009

(30) Foreign Application Priority Data

Jan. 11, 2008 (JP) ................................. 2008-003970

(51) Int. Cl.
*H01L 51/00* (2006.01)
(52) U.S. Cl. ........................................ 313/506; 313/504
(58) Field of Classification Search .................. 313/504, 313/506; 428/690
See application file for complete search history.

(56) References Cited

U.S. PATENT DOCUMENTS

| | | | |
|---|---|---|---|
| 6,406,801 B1 * | 6/2002 | Tokito et al. | 428/690 |
| 7,102,282 B1 | 9/2006 | Yamada et al. | |
| 2005/0225232 A1 * | 10/2005 | Boroson et al. | 313/504 |
| 2005/0249972 A1 * | 11/2005 | Hatwar et al. | 428/690 |
| 2006/0175966 A1 | 8/2006 | Yamada et al. | |

FOREIGN PATENT DOCUMENTS

WO    WO 01/39554 A1    5/2001

* cited by examiner

*Primary Examiner* — Karabi Guharay
(74) *Attorney, Agent, or Firm* — Oliff & Berridge, PLC

(57) ABSTRACT

A light-emitting apparatus is disclosed, which includes light-emitting elements provided on a substrate that each have a light-emitting layer interposed between a first electrode having a light-transmitting performance and a second electrode having a transflective performance. A light-reflecting layer is further arranged on the light-emitting layer, and an optical resonator structure is configured to resonate a light emitted from the light-emitting layer. A plurality of light-emitting elements are provided, having different resonance wavelengths, and an optical length of the light-emitting elements is set to be longer than $\lambda(m-\phi/2\pi)/2$.

6 Claims, 8 Drawing Sheets

BLUE

GREEN

FIG. 12A
FIG. 12B
FIG. 12C
FIG. 12D
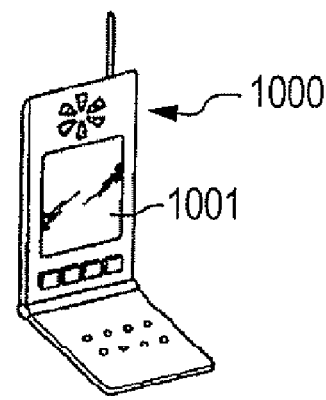
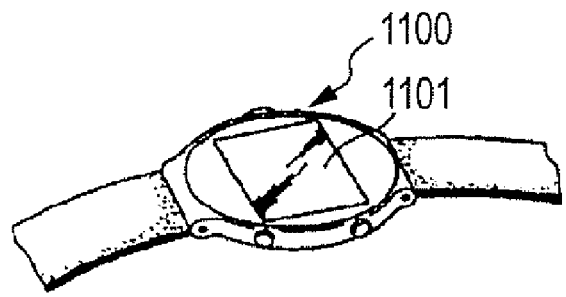
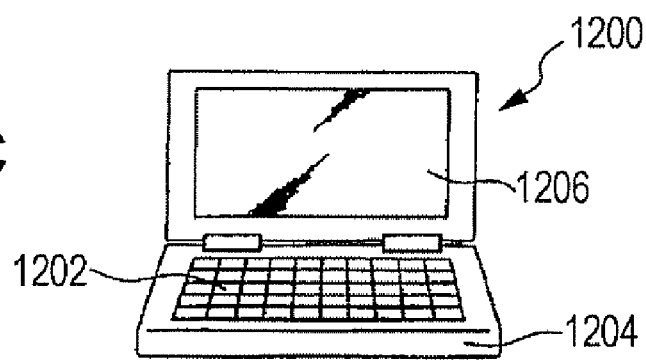
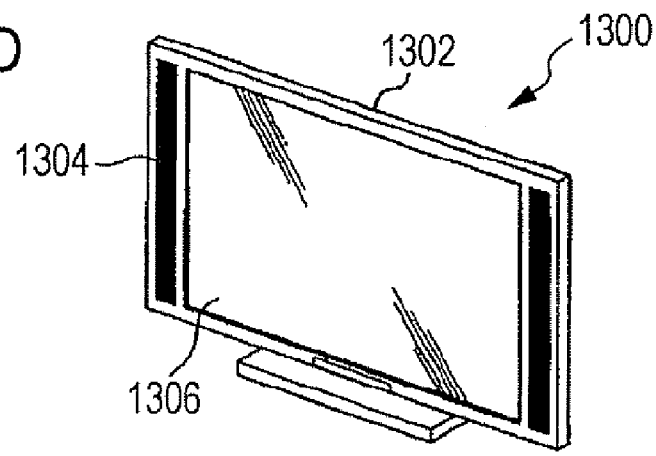

LIGHT-EMITTING APPARATUS INCLUDING OPTICAL RESONANCE STRUCTURE AND ELECTRONIC APPARATUS

BACKGROUND

1. Technical Field

The present invention relates to a light-emitting apparatus and an electronic apparatus.

2. Related Art

In recent years, there is a need for a light-emitting apparatus which consumes less electric power and is reduced in weight growing in association with diversification of information apparatus. As one of such light-emitting apparatuses, an organic electroluminescence apparatus (hereinafter, referred to as "organic EL apparatus") is known. The organic EL apparatus as described above generally includes a light-emitting element having a light-emitting layer between an anode (first electrode) and a cathode (second electrode). In addition, a configuration in which an electron hole injection/transport layer is arranged between the anode and the light-emitting layer and a configuration in which an electrode injection layer or a hole block layer is arranged between the light-emitting layer and the cathode are proposed to improve an electron hole injection property or an electrode injection property.

The organic EL apparatus described above has a problem such that the peak width of a spectrum of a light taken out from the light-emitting layer is wide, and the light-emitting luminance is low, so that sufficient color reproducibility cannot be obtained when it is applied to a display device. Therefore, a structure having a light-reflection layer formed between a substrate and the anode and the cathode being formed on a light-outgoing side of the light-emitting layer and having a transflective performance and includes an optical resonator structure which causes a light emitted from the light-emitting layer to resonate between the light-reflecting layer and the cathode is proposed.

In this configuration, the light emitted from the light-emitting layer reciprocates between the light-reflecting layer and the cathode, and only a light having a resonance wavelength corresponding to its optical length is amplified and taken out. Therefore, it is considered that a sharp light having a high luminance characteristic and a narrow spectrum is obtained.

However, the case of the organic EL apparatus in which the above-described optical resonator structure is employed has a problem such that when the spectrum width is reduced, the wavelength of the light shifts toward the low-wavelength side or the light-emitting luminance is lowered when a display surface is viewed obliquely, that is, with increase in angle of visibility, so that the light-emitting characteristic depends highly on the angle of visibility. Accordingly, as shown in International Publication No. 01/039554, a configuration which causes resonance with a certain degree of spectrum width by optimizing the optical length of a light emitted from the light-emitting layer is disclosed.

In recent years, further improvement of the angle-of-visibility characteristic is required in association with improvement of the quality of the organic EL apparatus.

FIG. 10 is a graph showing the angle-of-visibility characteristic of the light-emitting luminance in the related art. In FIG. 10, 0° on the vertical axis of an upper half portion represents the front in the direction of visual sense of a viewer (the direction of normal line of the display surface), that is, an angle of visibility of 0°. The light-emitting luminance is shown in a ratio in the case in which the light-emitting luminance is assumed to be 100% at a position of 0° in angle of visibility, and is shown on concentric circles with a center O representing 0% and an outermost circle representing 100%.

As shown in FIG. 10, in the related art, an optical length is optimized to achieve the highest light-emitting luminance at an angle of visibility of 0° for each of a red right R, a green light G, and a blue light B, respectively, so that an optimal white light W is emitted at an angle of visibility of 0°. The light-emitting luminance of each of R, G, and B is damped with increase in angle of visibility. In other words, the optical length is shifted from the optimal condition and is increased with increase in angle of visibility, and hence the light which is wanted to be taken out cannot be emitted under the condition of the optimal resonance wavelength. Accordingly, the peak wavelength of the spectrum of the light to be taken out is shifted to the lower wavelength side.

FIG. 11 is a chromaticity diagram showing the angle-of-visibility characteristic of the chromaticity in the related art. A solid line in this drawing shows a variation in peak wavelength of the spectrum in a case in which the angle of visibility is varied from 0° to 80°.

As shown in FIG. 11, in the related art, each of the red light, the green light, and the blue light is set to be emitted at an optimal chromaticity at positions of 0° in the angle of visibility (reference signs R1', G1', and B1' in FIG. 11), so that the white light (reference sign W1' in FIG. 11) is displayed. However, there is a problem such that when the peak wavelength of each color is shifted from the optimal condition toward the low-wavelength side (reference signs R2', G2', and B2' in FIG. 11) with increase in angle of visibility as described above, an entire color shift is generated correspondingly. In other words, the white light is displayed at the position of 0° in angle of visibility, while it is shifted toward the blue side (low-wavelength side) with increase in angle of visibility and hence is viewed as a blue light (reference sign W2' in FIG. 11).

SUMMARY

An advantage of some aspect of the invention is that there are provided a light-emitting apparatus and an electronic apparatus in which color shifting caused by the difference in angle of visibility is restrained.

A light-emitting apparatus according to the invention includes: a plurality of light-emitting elements provided on a substrate, the plurality of light-emitting elements each having a light-emitting layer interposed between a first electrode having a light-transmitting performance and a second electrode having a transflective performance; a light-reflecting layer arranged on the opposite side of the light-emitting layer with the intermediary of the first electrode; and an optical resonator structure configured to resonate a light emitted from the light-emitting layer between the light-reflecting layer and the second electrode, in which the plurality of light-emitting elements includes a plurality of light-emitting elements having different resonance wavelengths to be resonated in the optical resonator structure, and an optical length of at least the light-emitting elements which corresponds to one color of light from among lights emitted from the plurality of light-emitting elements between the light-reflecting layer and the second electrode in the direction of the normal line of the substrate is set to be longer than $\lambda(m-\phi/2\pi)/2$, where $\phi$ is a phase shift generated when the light emitted from the light-emitting layer is reflected from the first electrode or the second electrode, $\lambda$ is a peak wavelength of a spectrum of light which is wanted to be taken out from among lights emitted from the light-emitting layer, and m is integer number.

In this configuration, since the plurality of light-emitting elements having different resonance wavelengths to be resonated in the optical resonator structure are included, there is provided a light-emitting apparatus which is able to display full colors by forming, for example, the light-emitting elements having the resonance wavelengths corresponding to respective colors of light in Red (R), Green (G), and Blue (B).

By setting the optical length of at least the light-emitting elements corresponding to the one color between the light-reflecting layer and the second electrode in the direction of the normal line of the substrate to be longer than a condition which provides an optimal resonance wavelength, the light is emitted from the light-emitting elements corresponding to the one color at the condition which provides an optimal resonance wavelength when viewing the display surface from a position deviated from the front of the display surface, that is, when viewing obliquely. Accordingly, when the display surface is viewed from the oblique direction, the amount of shift of the light-emitting element of at least one color from the condition which provides an optimal resonance wavelength toward a low-wavelength side is smaller than those of the light emitting elements of other colors. Therefore, the color shifts of the light-emitting elements of other colors are compensated by the light-emitting element of at least one color, so that the entire color shift is restrained. Accordingly, the color shift caused by the difference in angle of visibility is restrained.

Preferably, the optical length of the light-emitting element emitting the red light between the light-reflecting layer and the second electrode is set to be longer than a condition which provides an optimal resonance wavelength in the direction of the normal line of the substrate.

In this configuration, by setting the optical length of the red light to be longer than the condition which provides an optimal resonance wavelength, even when the blue light and the green light having a wavelength shorter than that of the red light are shifted from the condition which provides an optimal resonance wavelength toward the low-wavelength side, the red light compensates the color shifts of the light-emitting elements of other colors, so that the entire color shift is restrained. Accordingly, the color shift caused by the difference in angle of visibility is restrained.

Preferably, the optical length of the light-emitting element emitting the green light between the light-reflecting layer and the second electrode is set to be longer than the condition which provides an optimal resonance wavelength in the direction of the normal line of the substrate.

In this configuration, by setting the optical length of the green light to be longer than the condition which provides an optimal resonance wavelength, the green light restrains the entire shifting toward the low-wavelength side. Accordingly, the color shift caused by the difference in angle of visibility is restrained.

Preferably, the resonance wavelength is adjusted by a film thickness of the first electrode.

In this configuration, by increasing the film thickness of the first electrode, the optical length of at least one color of light is easily increased.

Preferably, a colored layer which transmits a light having a wavelength corresponding to the resonance wavelength is arranged on the opposite side from the light-emitting layer with the intermediary of the second electrode.

In this configuration, only the light transmitted through the color filter from among the lights outputted from the optical resonance structure is taken out, and hence the light-emitting apparatus having a good color reproducibility is provided.

An electronic apparatus according to a second aspect of the invention includes the light-emitting apparatus described above.

In this configuration, since the above-described light-emitting apparatus is provided, a high-performance electronic apparatus in which the color shift generated by the difference in angle of visibility is restrained is provided.

BRIEF DESCRIPTION OF THE DRAWINGS

The invention will be described with reference to the accompanying drawings, wherein like number reference like elements.

FIGS. 12A to 12D are drawings showing electronic apparatuses according to an embodiment of the invention.

DESCRIPTION OF EXEMPLARY EMBODIMENTS

Figure 1:
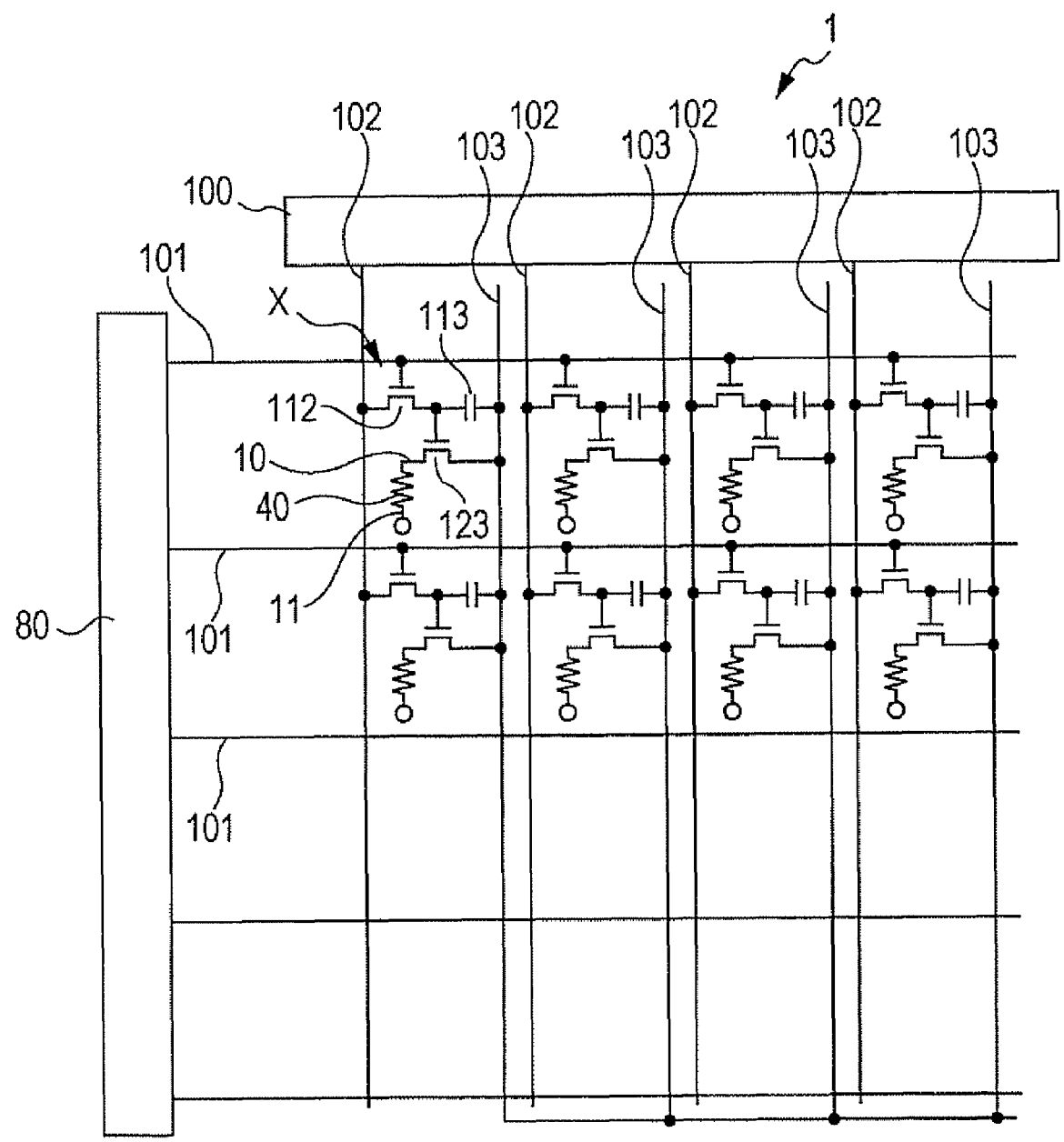
FIG. 1 is a drawing showing a wiring structure of an organic EL apparatus according to an embodiment of the invention.

Referring now to the drawings, embodiments of the invention will be described. These embodiments show part of the modes of the invention, and are not intended to limit the invention. Therefore, modifications may be made as desired within the scope of technical ideas of the invention. In the drawings, scaling is differentiated among respective layers or members in order to make the respective layers and members recognizable in the drawings.

Organic EL Apparatus

FIG. 1 is a schematic drawing sowing a wiring structure of an organic EL apparatus according to an embodiment. Reference numeral 1 in FIG. 1 designates the organic EL apparatus.

The organic EL apparatus 1 is of an active matrix system using a Thin Film Transistor (hereinafter, referred to as TFT) as a switching element, and has a wiring configuration including a plurality of scanning lines 101, . . . , a plurality of signal lines 102, . . . extending in the direction intersecting the respective scanning lines 101 at a right angle, and a plurality of power source lines 103, . . . extending in parallel to the respective signal lines 102, and pixel areas (unit pixel area) X formed near respective intersections between the plurality of scanning lines 101, and the plurality of signal lines 102, . . . .

According to the technical idea in the invention, the active matrix using the TFT or the like is not essential component, and completely the same effects are achieved at a low cost even by using an element substrate for passive matrix to implement the invention and performing a passive matrix addressing.

A data line drive circuit 100 including a shift register, a level shifter, a video line, and an analogue switch is connected to signal lines 102. A scanning line drive circuit 80 having the shift register and the level shifter is connected to scanning lines 101.

In addition, the pixel areas X each includes a switching TFT (switching element) 112 which receives a supply of scanning signals to a gate electrode via the scanning lines 101, a retaining capacity 113 that retains pixel signals shared from the signal lines 102 via the switching TFT 112, a drive TFT (switching element) 123 which receives a supply of pixel signals retained by the retaining capacity 113 to the gate electrode, an anode 10 which receives a flow of drive current from the power source lines 103 when being electrically connected to the power source lines 103 via the drive TFT 123, and a light-emitting layer 40 interposed between the anode 10 and a cathode 11.

With the organic EL apparatus 1, when the scanning lines 101 are driven and the switching TFT 112 is brought into an ON state, the potential of the signal lines 102 is retained in the retaining capacity 113, and the ON-OFF state of the drive TFT 123 is determined according to the state of the retaining capacity 113. Then, an electrical current flows from the power source lines 103 to the anode 10 via a channel of the drive TFT 123, and then the electric current flows to the cathode 11 via the light-emitting layer 40. The light-emitting layer 40 emits light according to the amount of current which flows therein.

Figure 2:
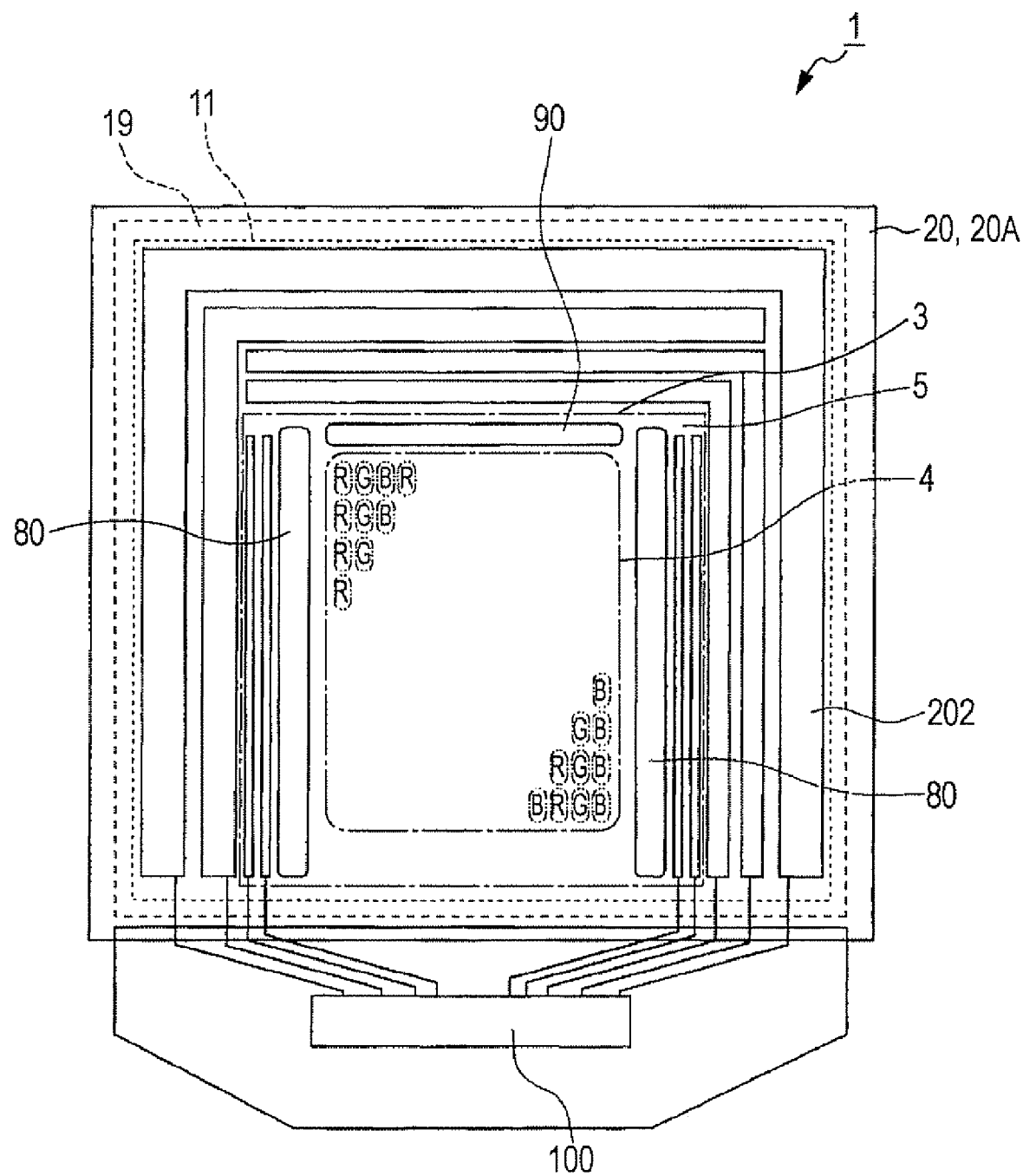
FIG. 2 is a schematic drawing showing a configuration of the organic EL apparatus.
Figure 3:
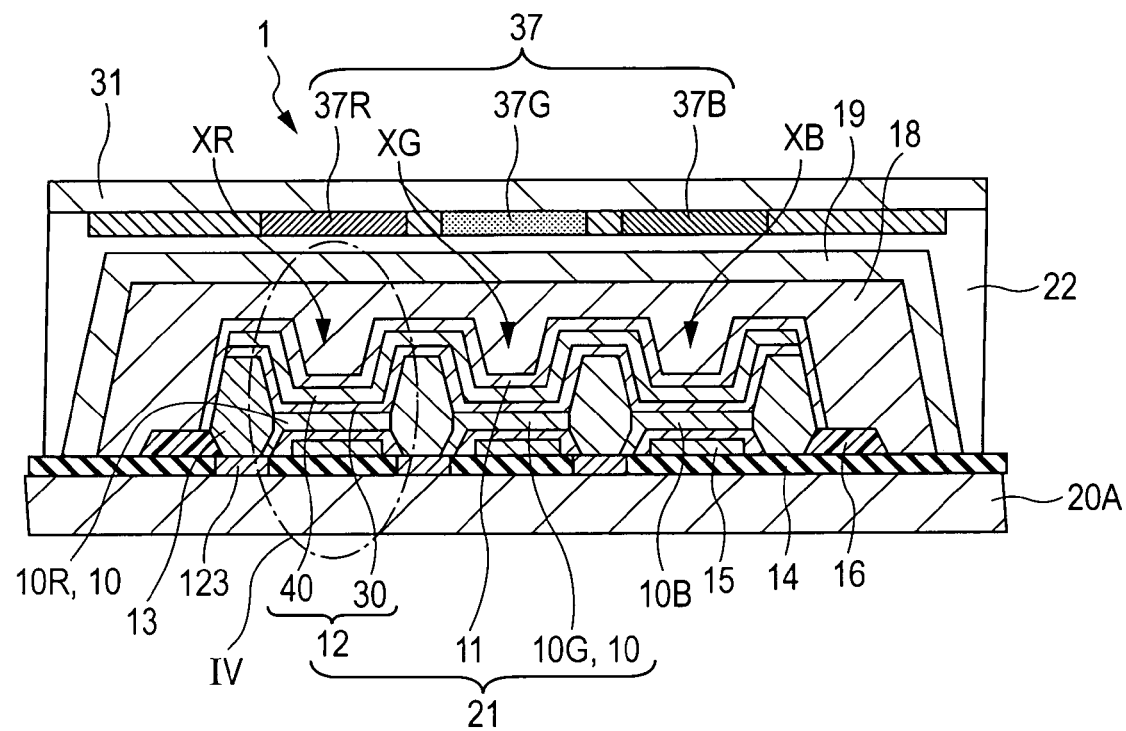
FIG. 3 is a cross-sectional view schematically showing the organic EL apparatus.

Referring now to FIG. 2 to FIG. 11, a detailed example of the organic EL apparatus in the embodiment will be described. FIG. 2 is a plan view schematically showing a configuration of the organic EL apparatus. FIG. 3 is a cross-sectional view schematically showing the organic EL apparatus.

First of all, referring to FIG. 2, a configuration of the organic EL apparatus 1 will be described.

FIG. 2 is a drawing showing various wirings described above formed on a substrate body 20, the TFT, and a TFT element substrate (hereinafter, referred to as "element substrate") 20A which causes the light-emitting layer 40 to emit a light by the respective circuits.

The TFT element substrate 20A of the organic EL apparatus includes a real display area 4 at a central portion (within a double-dashed chain line in FIG. 2), and a dummy area 5 arranged around the real display area 4 (areas between a chain line and the double-dashed chain line).

Any one of the red light (R), the green light (G), and the blue light (B) is taken out from the pixel areas X shown in FIG. 1, and display areas RGB shown in FIG. 2 are formed. In the real display area 4, the display areas RGB are arranged in a matrix pattern. The display areas RGB are arranged in such a manner that the areas of the same color are arranged in the same row in the vertical direction of the paper, so that so-called a stripe pattern is configured. Then, the display areas RGB constitute a display unit pixel in combination, and the display unit pixel achieves full color display by mixing light-emission in RGB colors.

Scanning line drive circuits 80 and 80 are arranged on both sides of the real display area 4 in FIG. 2 on the underlying side of the dummy area 5. An inspection circuit 90 is arranged on the upper side of the real display area 4 in FIG. 2 and on the underlying side of the dummy area 5. The inspection circuit 90 is a circuit for inspecting the operating state of the organic EL apparatus 1, and includes an inspecting information outputting unit (not shown) configured, for example, to output the result of inspection to the outside, so that the inspection of the quality and defects of the organic EL apparatus 1 during manufacture or at the time of shipment is achieved.

As shown in FIG. 3, the organic EL apparatus 1 in the embodiment is an organic EL apparatus having so-called a "top emission structure". The organic EL apparatus 1 includes a plurality of light-emitting elements 21 having a organic functional layer 12 interposed between the anode 10 and the cathode 11 and placed on the TFT element substrate 20A, a pixel diaphragm 13 for dividing the each light-emitting element 21 into the respective pixel areas XR, XG, and XB, and a sealing substrate 31 arranged so as to oppose the TFT element substrate 20A. The organic EL apparatus 1 has a configuration to take out a light emitted from the sealing substrate 31 side as an opposed side of the TFT element substrate 20A, and hence any of a transparent substrate and an opaque substrate may be used as the material of the TFT element substrate 20A. The opaque substrate includes, for example, heat-cured resin, thermoplastic resin or the like in addition to ceramics such as alumina or a metallic sheet formed of stainless steel applied with an insulating process such as surface oxidizing or the like.

An inorganic insulating layer 14 formed of silicon nitride is formed on the TFT element substrate 20A. A flattening layer 16 having a metallic reflection panel (light reflecting layer) 15 formed of aluminum alloy or the like integrated therein is formed on the inorganic insulating layer 14. The flattening layer 16 is formed of heat-resistant insulative resin or the like such as acryl-based or polyimide-based resin, and is formed to eliminate roughness on the surface of the drive TFT 123 or the like.

The anode 10 is formed on the flattening layer 16. The anode 10 is formed of oxide-based transparent conductive material and, more specifically, ITO (Indium Tin Oxide) is preferably used. The anode 10 is formed corresponding to each of the light-emitting element 21, and is connected at one end side thereof to the drive TFT 123 via a contact hole (not shown) formed on the inorganic insulating layer 14.

The pixel diaphragm 13 is formed on the anodes 10. The pixel diaphragm 13 has openings on the anodes 10, and is intended to segmentalize the plurality of light-emitting elements 21 independently. In other words, the areas surrounded by the pixel diaphragm 13 corresponds to the pixel areas X of the light-emitting elements 21 (see FIG. 1), and the pixel areas X are assigned as respective pixel areas XR, XG, XB from which respective lights of red light, blue light, and the green light are taken out from the sealing substrate 31 side. As a material for forming the pixel diaphragm 13, for example, an organic substance having an insulating property such as polyimide, acryl or the like may be employed. As a material for forming the pixel diaphragm 13, a substance including a combination of an inorganic substance and an organic substance may also be employed.

The light-emitting element 21 includes an electron hole injection/transport layer 30 and the light-emitting layer 40.

The electron hole injection/transport layer 30 is used for injecting and transporting the electron hole of the anode 10 into the light-emitting layer 40, and is formed on the element substrate 20A so as to straddle the respective parts of the pixel diaphragm 13. As a material for forming the electron hole injection/transport layer 30, specifically, a water dispersion of 3,4-polyethylenedioxythiophene/polystyrene sulfonate (PEDOT/PSS) is preferably used. The material for forming the electron hole injection/transport layer 30 is not limited to those shown above, and various materials may be used. For example, a material obtained by dispersing polystyrene, polypyrrol, polyaniline, polyacetylene or derivatives thereof in an adequate dispersion medium such as the polystyrene sulfonate.

The light-emitting layer 40 is a portion where electrons injected from the cathode 11 and electron holes injected from the electron hole injection/transport layer 30 are coupled and emits a light having a predetermined wavelength, and is formed over the entire area of the electron hole injection/transport layer 30. The light-emitting layer 40 employs a white light-emitting layer which includes laminated light-emitting materials which emit the red light, the green light, and the blue light and emits a white light. As a material of the light-emitting layer 40, for example, polysilane-based high-polymer organic material such as polyfluorene derivatives (PF), polyparaphenylenevinylene derivatives (PPV), polyparaphenylene derivatives (PPP), polyvinylcarbazole (PVK), polythiophenes derivatives, polymethyl phenylsilane (PMPS) may be used. Alternatively, the above-described high-polymer organic materials doped with a low-polymer organic material such as perylene-based pigment, coumarin-based pigment, rhodamine-based pigment, rubrene, 9,10-diphenylanthracene, tetraphenylbutadiene, nile red, quinacridone may be used. Preferably, an electron transport layer or a hole block layer is formed on the light-emitting layer 40.

Figure 4:
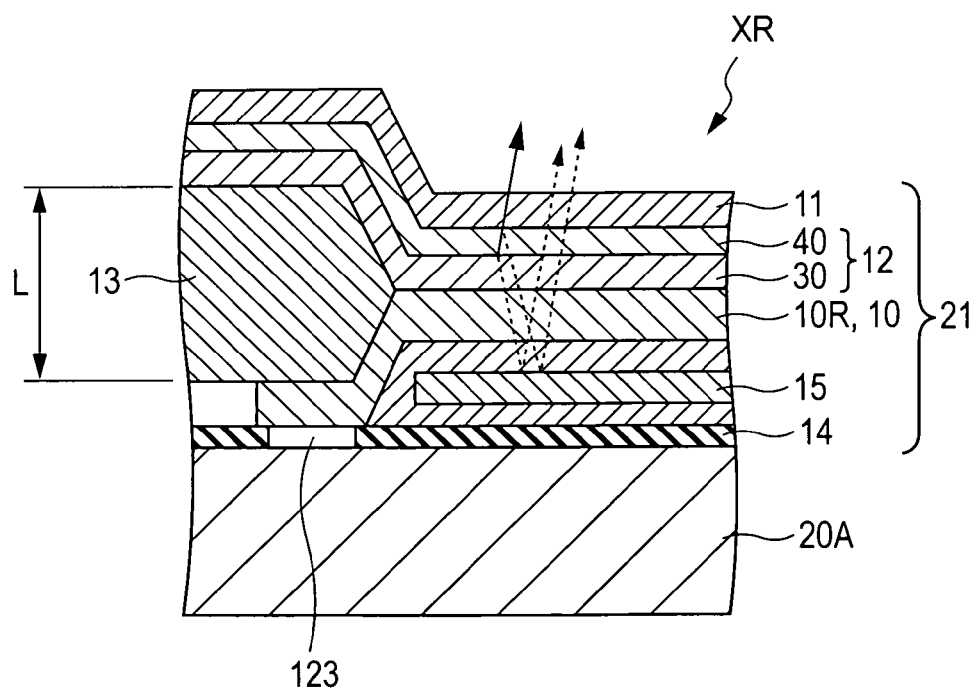
FIG. 4 is a drawing showing a part IV in FIG. 3 in an enlarged scale.

The cathode 11 has a transflective performance which transmits part of the light emitted from the light-emitting layer 40, and reflects the remaining light partly or entirely toward the metallic reflection panel 15, and is formed to cover the pixel diaphragm 13 and the light-emitting layer 40 (see an arrow in FIG. 4). In general, the translucent conductive film such as ITO described above has a reflectance ratio on the order of 10% at a boundary with respect to an atmospheric layer, and the cathode 11 which employs such the translucent conductive film has the transflective performance as described above unless otherwise provided a specific device.

An organic buffer layer 18 is formed on the cathode 11. Because of the influence of the shape of the pixel diaphragm 13, the organic buffer layer 18 is arranged so as to fill the concave-convex portion of the cathode 11 formed into a concave-convex shape, and the upper surface thereof is formed into a substantially flat shape. The organic buffer layer 18 has a function to alleviate a stress generated by the warp or the volume expansion of the element substrate 20A and prevent the cathode 11 from separating from the pixel diaphragm 13 having an unstable shape. Since the upper surface of the organic buffer layer 18 is flattened, a gas barrier layer 19, described later, formed of a hard coating film to be formed on the organic buffer layer 18 is also flattened. Therefore, a portion where the stress is intensively applied is eliminated, and hence generation of cracks in the gas barrier layer 19 is prevented.

The gas barrier layer 19 is formed on the organic buffer layer 18 so as to cover the organic buffer layer 18. The gas barrier layer 19 has a function to prevent entry of oxygen or water content, whereby the light-emitting elements 21 are prevented from being deteriorated by the oxygen or the water content. The material of the gas barrier layer 19 is preferably formed of silicon compound containing nitrogen, that is, silicon nitride or silicon oxynitride considering its transparency, gas barrier property, and water-resistant property.

A seal layer 22 is formed on the gas barrier layer 19 so as to cover the gas barrier layer 19. The seal layer 22 has a function to fix the sealing substrate 31 on the gas barrier layer 19 and damper a mechanical impact from the outside, so that the light-emitting layer 40 and the gas barrier layer 19 are protected. The seal layer 22 is formed of an adhesive agent which is a resin such as urethane-based, acryl-based, epoxy-based, or polyolefin-based resin, which is softer than the sealing substrate 31 and low in glass transition point.

The sealing substrate 31 is arranged so as to oppose the element substrate 20A described above. The sealing substrate 31 has an upper surface which functions as a display surface for taking out emitted light, and hence is formed of a light transmissive material such as glass or transparent plastic (such as polyethylene terephthalate, acryl resin, polycarbonate, and polyolefin).

A color filter 37 having a red colored layer 37R, a green colored layer 37G, and a blue colored layer 37B arranged in a matrix pattern is provided on the lower surface of the sealing substrate 31. The respective colored layers 37R, 37G, and 37B are layers formed by mixing pigment or dye stuff with the transparent binder layer, and are adjusted to red (R), green (G) or blue (B) as intended by selecting the pigment. The colored layers 37R, 37G, and 37B may be formed by patterning color resist in respective colors. The layers of light blue, light cyan, white, and so on may be added to the colored layers 37R, 37G, and 37B according to the purpose.

The colored layers 37R, 37G, and 37B are respectively arranged so as to oppose the anode 10 of the light-emitting element 21. Accordingly, only lights corresponding to the wavelengths of the respective colors from among the light emitted from the light-emitting layer 40 (for example, the red light has a wavelength of 619 nm, the green light has a wavelength of 530 nm, and the blue light has a wavelength of 470 nm) transmit the respective colored layers 37 and are emitted toward the viewer as the lights in respective colors. In this manner, only the lights transmitted through the colored layers 37R, 37G, and 37B is taken out, and hence the organic EL apparatus 1 having a good color reproducibility is provided.

A black matrix layer 32 is formed between the areas of the colored layers 37R, 37G, and 37B. The black matrix layer 32 segmentalizes the colored layers 37 and functions as a non-light-emitting portion, and prevents light-leakage between the adjacent respective pixel areas XR, XG, XB. The material of the black matrix layer 32 is a light-shielding layer formed of resin mixed with pigment such as carbon black. The black matrix layer 32 may be mixed with resin having a liquid repellant property such as fluorine contained resin.

FIG. 4 is a drawing showing a part IV in FIG. 3 in an enlarged scale. In FIG. 4, layers present from the cathode 11 upward are omitted for facilitating explanation.

As shown in FIGS. 3 and 4, the light-emitting layer 40 described above is interposed between the cathode 11 having the transflective function and the metallic reflection panel 15, and there is provided an optical resonator structure for causing a light emitted from the light-emitting layer 40 to resonate between the cathode 11 and the metallic reflection panel 15. In this configuration, the light emitted from the light-emitting layer 40 reciprocates between the metallic reflection panel 15 and the cathode 11, and only light having a resonance wavelength corresponding to its optical length is amplified and taken out (see an arrow in FIG. 4). Therefore, it is considered that a light having a high light-emitting luminance and sharp spectrum is obtained.

The resonance wavelength of the each light-emitting element 21 is obtained from the summation of products of the optical length between the metallic reflection panel 15 and the cathode 11, that is, the respective film thicknesses and the indexes of refraction of the respective layers (for example, the organic functional layer 12, the anode 10) formed between the metallic reflection panel 15 and the cathode 11. In the embodiment, the resonance wavelengths of the respective pixel areas XR, XG, XB are differentiated by adjusting the optical lengths in the optical resonator structure between the metallic reflection panel 15 and the cathode 11 in the respective pixel areas XR, XG, XB. In other words, since the plurality of light-emitting elements 21 having different resonance wavelengths in the optical resonator structure are included, the different colors (the red light, the green light, and the blue light) are emitted from the light-emitting layer 40 which emits the white light.

These resonance wavelengths are adjusted by the film thickness of the anodes 10 of the light-emitting elements 21 in the embodiment. More specifically, the film thicknesses of the anodes 10 in the respective pixel areas XR, XG, XB are such that the film thickness of an anode 10R of the pixel area XR having the longest resonance wavelength is the largest, then, that of an anode 10G of the pixel area XG, and then an anode 10B of the pixel area XB, which is the smallest. The optical length is normally set to provide a condition which provides an optimal resonance wavelength to the light-emitting elements 21 which emit the respective colors of lights when the display surface (the surface of the sealing substrate 31) is viewed from the front, that is, when the angle of visibility is 0°. More specifically, $2L' = \lambda (m - \phi/2\pi)$ (m is integer number) is satisfied, where L' is the optical length, $\phi$ is the phase shift generated when the light emitted from the light-emitting layer 40 is reflected from the anode 10 or the cathode 11 (for example, $-3/2\pi$ (rad)), and $\lambda$ is a peak wavelength of the spectrum of the light which is wanted to be taken out from among the lights emitted from the light-emitting layer 40. The angle of visibility described above is an angle between the visual angle and the normal line of the display surface of the sealing substrate 31.

Figure 10:
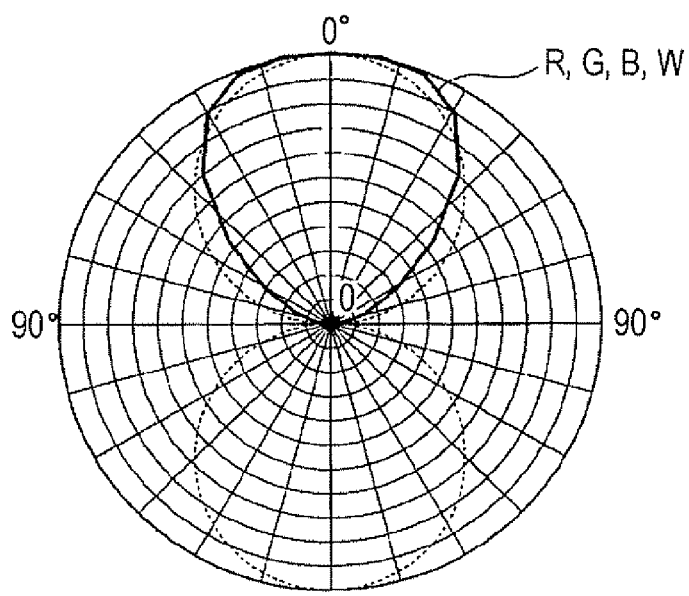
FIG. 10 is a graph showing the angle-of-visibility characteristic of the light-emitting luminance in the related art.

However, as shown in FIG. 10, in the related art, an optical length is optimized to achieve the highest light-emitting luminance at an angle of visibility of 0° for each of a red right R, a green light G, and a blue light B, respectively, so that an optimal white light W is emitted from the display surface at an angle of visibility of 0°. Then, the light-emitting luminance of each of R, G, and B is damped with increase in angle of visibility. In other words, the optical length is increased from the condition which provides an optimal resonance wavelength with increase in angle of visibility, and hence the light which is wanted to be taken out cannot be emitted from the respective pixel areas XR, XG, XB under the condition of the optimal resonance wavelength. Accordingly, the peak wavelength of the spectrum of the light to be taken out is shifted to the lower wavelength side.

Figure 11:
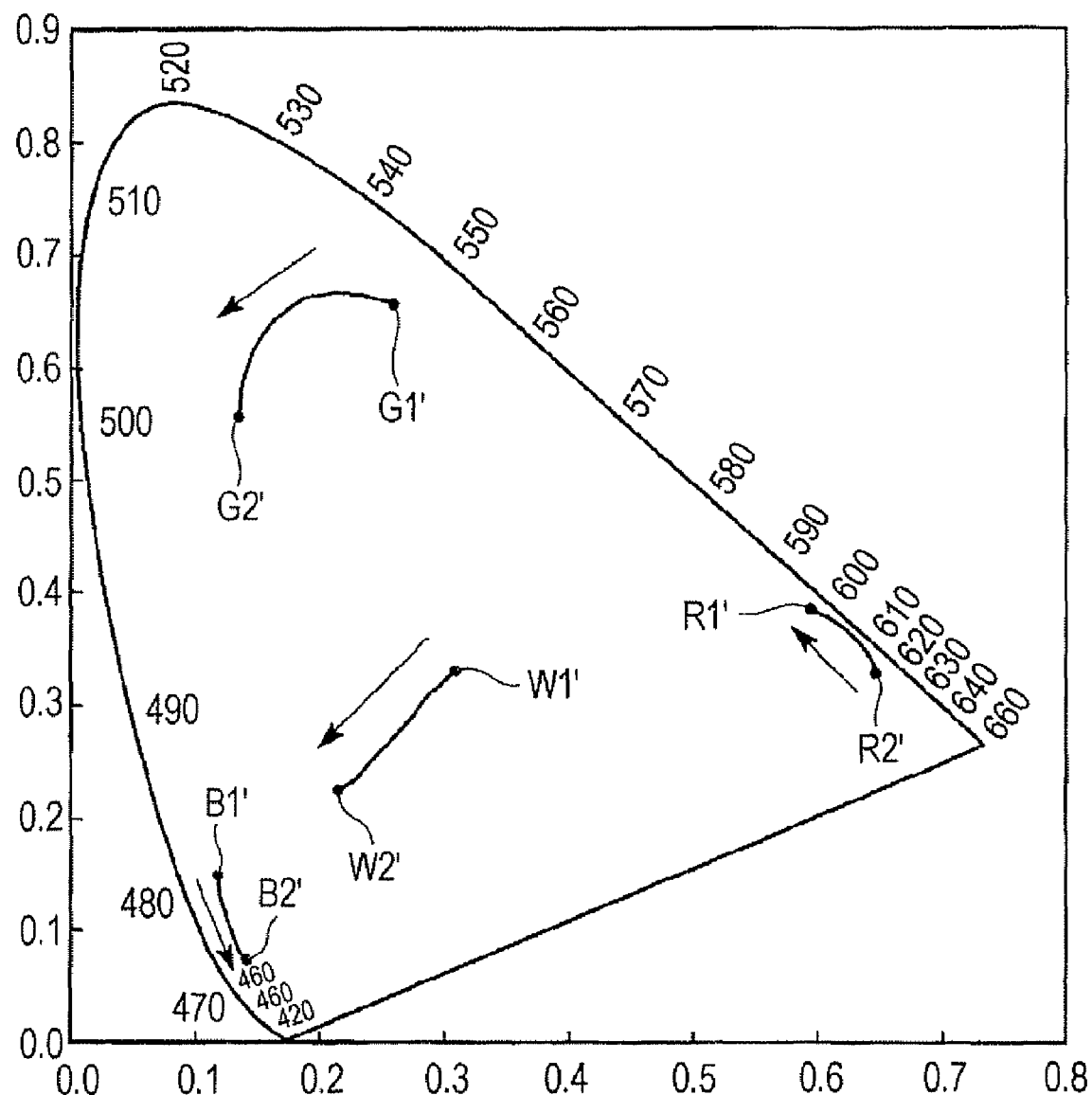
FIG. 11 is a chromaticity diagram showing the angle-of-visibility characteristic of the chromaticity in the related art.

As shown in FIG. 11, in the related art, each of the red light, the green light, and the blue light is set to be emitted at an optimal chromaticity at positions of 0° in the angle of visibility (reference signs R1', G1', and B1' in FIG. 11), so that the white light (reference sign W1' in FIG. 11) is displayed. However, there is a problem such that when the peak wavelength of each color is shifted from the condition which provides an optimal resonance wavelength toward the low-wavelength side (reference signs R2', G2', and B2' in FIG. 11) with increase in angle of visibility as described above, an entire color shift is generated correspondingly. In other words, the white light is displayed at the position of 0° in angle of visibility, while it is shifted toward the blue side (low-wavelength side) with increase in angle of visibility and hence is viewed as a blue light (reference sign W2' in FIG. 11).

Therefore, in the embodiment, a light which transmits the red colored layer 37R from among the lights emitted from the light-emitting layer 40, that is, an optical length L between the metallic reflection panel 15 and the cathode 11 in the direction of the normal line of the element substrate 20A of the pixel area XR (see FIG. 4) becomes longer than the condition which provides an optimal resonance wavelength described above ($L > \lambda (m - \phi/2\pi)/2$). More specifically, it is preferable to set the condition of the resonance wavelength of the optical length L at an angle of visibility of 0° of the pixel area XR to be able to take a peak wavelength of 620 nm to 660 nm, more preferably, 620 nm to 630 nm.

As a method of setting the optical length L, the film thickness of the light-emitting element 21 in the pixel area XR to be thicker than the film thickness which provides the condition which provides an optimal resonance wavelength. The adjustment of the film thickness is preferably achieved by adjusting the film thickness of the anode 10R in the light-emitting element 21 of the pixel area XR. Since the anode 10 is formed for each of the pixel areas XR, XG, XB, only the anode 10R which corresponds to the light-emitting element 21 of the pixel area XR can be adjusted easily by increasing the optical length by adjusting the film thickness of the anode 10, so that the efficiency of manufacture is maintained.

Figure 5:
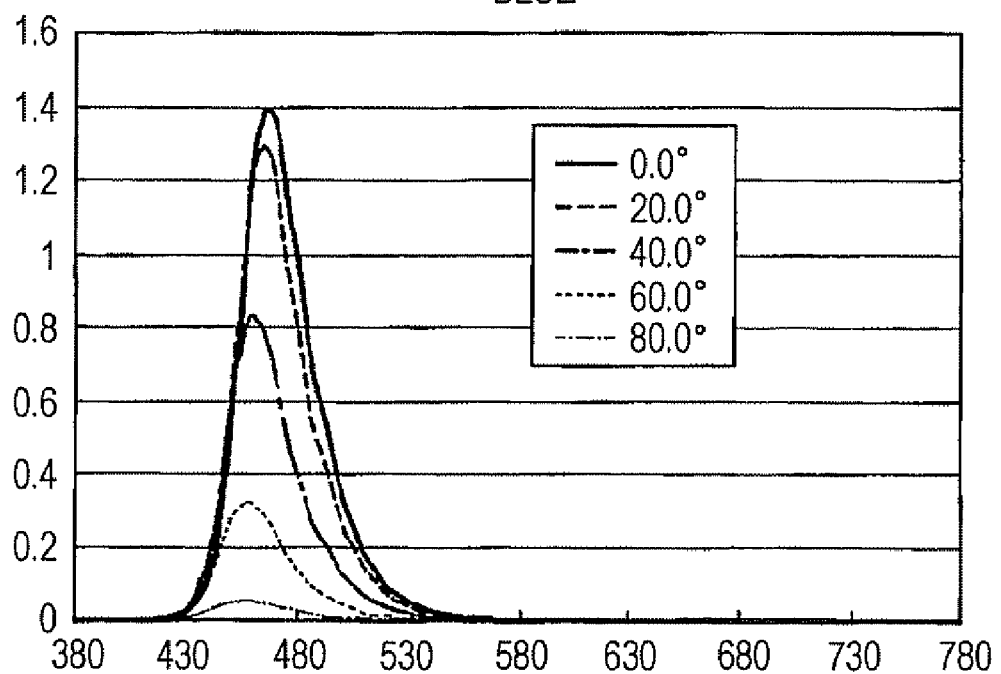
FIG. 5 is a graph showing a spectrum of a wavelength of a blue light.
Figure 6:
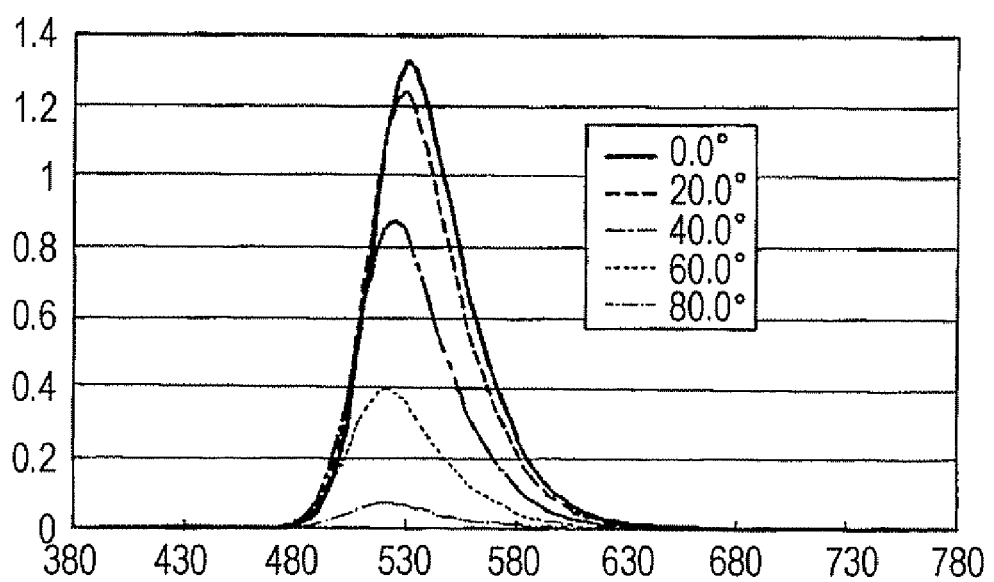
FIG. 6 is a graph showing a spectrum of a wavelength of a green light.
Figure 7:
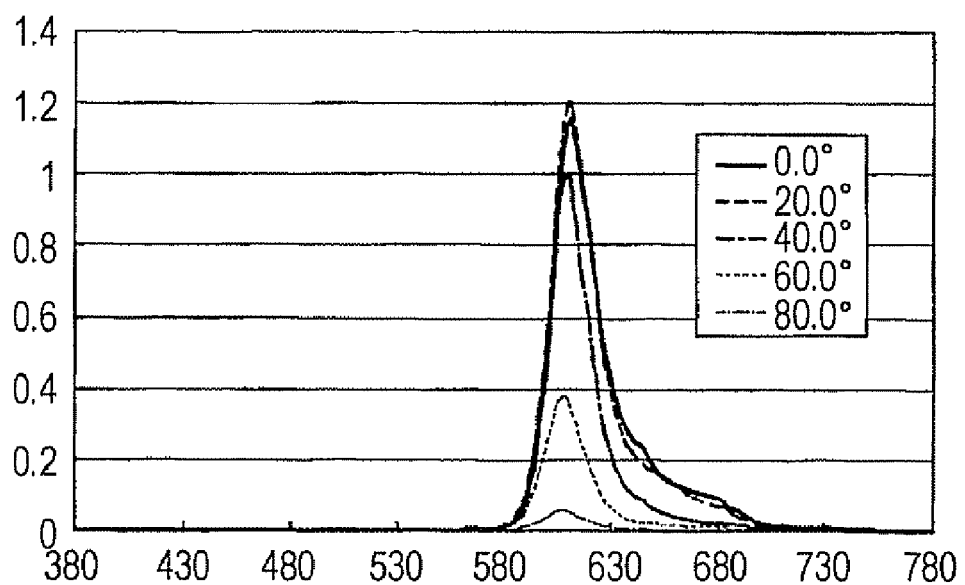
FIG. 7 is a graph showing a spectrum of a wavelength of a red light.

FIGS. 5 to 7 are graphs showing the peak wavelengths of the spectrum when the angle of visibility is changed from 0° to 80° for the respective colors. FIG. 5 shows that of the blue light, FIG. 6 shows that of the green light, and FIG. 7 shows that of the red light.

As shown in FIGS. 5 and 6, in the light-emitting elements 21 for the green light and the blue light (see FIG. 4), the peak wavelength of the light which is wanted to be taken out is maximized at an angle of visibility of 0° (for example, a wavelength 530 nm for the green light, and a wavelength of 470 nm for the blue light). Then, the peak wavelength is shifted from the condition which provides an optimal resonance wavelength of the light which is wanted to be taken out toward the low-wavelength side as the angle of visibility is increased from 20° to 80°.

In contrast, as shown in FIG. 7, in the case of the light-emitting element 21 of the pixel area XR (see FIG. 4), the peak wavelength is on the order of 620 nm at an angle of visibility of 0°, and is longer than the peak wavelength of the light which is wanted to be taken out (for example, a wavelength of 610 nm). When the angle of visibility is increased and the peak wavelength is shifted to the low-wavelength side, the peak wavelength of the light which is wanted to be taken out assumes the maximum level at an angle of visibility of 20°. In other words, since the optical length L of the light-emitting element 21 of the pixel area XR is set to be longer than the condition which provides an optimal resonance wavelength, the light-emitting element 21 of the pixel area XR emits the light which is wanted to be taken out under the condition which provides an optimal resonance wavelength when the display surface is viewed from the oblique direction. In other words, in the case of the red light, the amount of shift of the light which is wanted to be taken out from the condition which provides an optimal resonance wavelength toward the low-wavelength side is smaller than those of the green light and the blue light.

Figure 8:
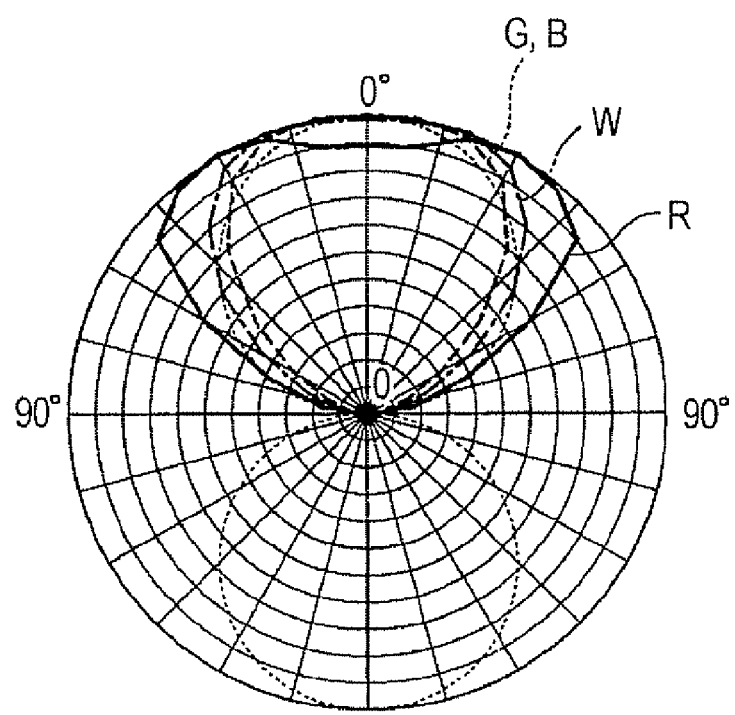
FIG. 8 is a graph showing an angle-of-visibility characteristic of a light-emitting luminance.

FIG. 8 is a graph showing an angle-of-visibility characteristic of the light-emitting luminance in the embodiment.

As shown in FIG. 8, in the case of the green light G and the blue light B, the optical length is optimized so that the light-emitting luminance of the peak wavelength of the light which is wanted to be taken out is maximized at the position of an angle of visibility of 0°, and the light-emitting luminance is damped with increase in angle of visibility.

In contrast, in the case of the red light R, the light-emitting luminance is increased once and then is damped as the angle of visibility is increased from 0°. More specifically, the light-emitting luminance of the peak wavelength of the light which is wanted to be taken out is maximized when the angle of visibility is 20°, and the light-emitting luminance is damped with increase in angle of visibility. In other words, the damping of the light-emitting luminance of the red light is slower than those of the green light G and the blue light B. Correspondingly, the damping of the light-emitting luminance of the white light W is slower than those of the green light G and the blue light B.

Figure 9:
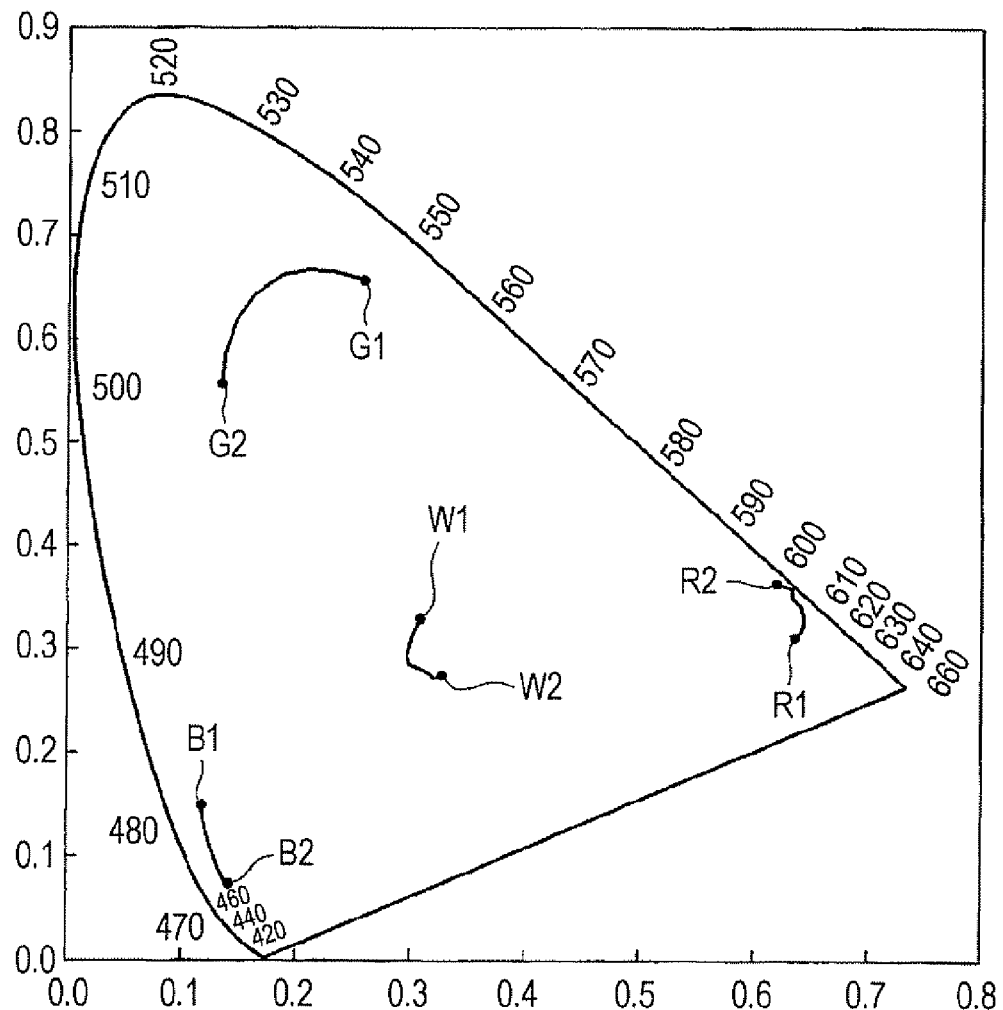
FIG. 9 is a chromaticity diagram showing the angle-of-visibility characteristic of a chromaticity.

FIG. 9 is a chromaticity diagram showing the angle-of-visibility characteristic of the chromaticity in the embodiment. A solid line in this drawing shows a variation in peak wavelength of the spectrum in a case in which the angle of visibility is varied from 0° to 80°.

As shown in FIG. 9, the chromaticities of the respective colors at an angle of visibility of 0° are R1 for the red light, G1 of the green light, and B1 for the blue light. As the angle of visibility increases, the red light is shifted to R2, the green light to G2, and the blue light to B2, toward the low-wavelength side. At this time, in the case of the light-emitting element 21 which emits the red light, the amount of shift from the condition which provides an optimal resonance wavelength of the light which is wanted to be taken out toward the low-wavelength side is smaller than those of the light-emitting element 21 for the green light and the light-emitting element 21 for the blue light. (R1 to R2 in FIG. 9). Therefore, even when the blue light and the green light having a shorter wavelength than the red light are shifted toward the low-wavelength side, the color shifts of the blue light and the green light are compensated by the red light. In other words, since the red light restrains the peak wavelength of the light which is wanted to be taken out with increase in angle of visibility, the red light pulls the blue light and the green light which are shifted toward the low-wavelength side (G1 to G2, B1 to B2 in FIG. 9) with increase in angle of visibility. Accordingly, the white light is restrained from shifting toward the blue color (low-wavelength side), and the amount of shift of the white light is restrained within a range from W1 to W2. Therefore, the entire color shift caused by the difference in angle of visibility is restrained.

As described thus far, according to the embodiment, by setting the optical length L between the metallic reflection panel 15 and the cathode 11 at an angle of visibility of 0° of the light-emitting element 21 of the pixel area XR to be longer than the condition which provides an optimal resonance wavelength, the light emitted from the light-emitting element 21 of the pixel area XR is emitted under the condition which provides an optimal resonance wavelength when viewing a position shifted from the front of the display surface, that is, when viewing the display surface from the oblique direction. Accordingly, when the display surface is viewed from the oblique direction, the amount of shift from the condition which provides an optimal resonance wavelength toward the low-wavelength side of the light-emitting element 21 of the pixel area XR is smaller than those of the light-emitting element 21 of the pixel area XG and the light-emitting element 21 of the pixel area XB. Therefore, the color shifts of the green light and the blue light are compensated by the red light, so that the entire color shift is restrained. Accordingly, the color shift caused by the difference in angle of visibility is restrained.

Electronic Apparatus

Subsequently, an electronic apparatus according to another aspect of the invention will be described.

The electronic apparatus includes the organic EL apparatus 1 described above as a display unit, and more specifically, apparatuses shown in FIG. 12 are exemplified.

FIG. 12A is a perspective view showing an example of a mobile phone. In FIG. 12A, a mobile phone 1000 includes a display unit 1001 using the organic EL apparatus 1 described above.

FIG. 12B is a perspective view showing an example of a wrist watch type electronic apparatus. In FIG. 12B, a watch (electronic apparatus) 1100 includes a display unit 1101 using the organic EL apparatus 1 described above.

FIG. 12C is a perspective view showing an example of a mobile data processing apparatus such as a word processor or a personal computer. In FIG. 12C, a data processing apparatus 1200 includes an input unit 1202 such as a keyboard, a display unit 1206 using the organic EL apparatus 1 described above, and a data processing apparatus body (casing) 1204.

FIG. 12D is a perspective view showing an example of a low-profile big-screen TV. In FIG. 12D, a low-profile big-screen TV 1300 includes a low-profile big-screen TV body (casing) 1302, a voice output unit 1304 such as a speaker, and a display unit 1306 using the organic EL apparatus 1 described above.

The electronic apparatuses shown in FIGS. 12A to 12D includes the display units 1001, 1101, 1206, and 1306 having the organic EL apparatus 1 described above, and hence restraint of the color shift caused by the difference in angle of visibility in the display unit is achieved.

The electronic apparatus is not limited to a case of providing the organic EL apparatus 1 as the display unit, but may be provided as a light-emitting unit. For example, the electronic apparatus may be a page printer (image forming apparatus) having the organic EL apparatus 1 as an exposure head (line head).

The technical scope of the invention is not limited to the embodiments shown above, and includes various modifications without departing the scope of the invention. For example, the above-described ink compositions of the electron hole injection/transport layer or the light-emitting layer are not limited by the mode of the molecular such as low-polymer, high-polymer, or dendrimer, and fluorescent material and phosphorescent material are both effective as the material of the light-emitting layer.

Although the case of increasing the film thickness of the anode of the red light has been described as a method of setting the optical length, the film thickness of the organic functional layer may be increased.

It is also possible to adjust the optical length by adjusting the refractive index by changing the materials of the organic functional layer or the anode.

Although only the optical length of the red light is set to be longer than the condition which provides an optimal resonance wavelength in the description of the embodiment, it is also possible to set the optical length of the green light to be longer than the condition which provides an optimal resonance wavelength in addition to the red light. In this case, the peak wavelength of the green light at an angle of visibility of 0° is preferably set to be longer by about 5 nm to avoid generation of the color shift at an angle of visibility of 0°.

Although the red light, the green light, and the blue light are emitted by causing the white light emitted from the white light-emitting layer to transmit the colored layer in the description of the embodiment, a configuration in which a red light-emitting layer, a green light-emitting layer, and a blue light-emitting layer are formed respectively between the respective pixel diaphragms (pixel areas) is also applicable.

In the organic EL apparatus employing the optical resonator structure, since the full color display is enabled by forming the light-emitting elements having the resonance wavelengths corresponding respectively to the red color, the green color, and the blue color, a configuration having no color filter described above is also applicable.

The entire disclosure of Japanese Patent Application No. 2008-003970, filed Jan. 11, 2008 is expressly incorporated by reference herein.

What is claimed is:

1. A light-emitting apparatus comprising:
a substrate;
a first light-emitting element over the substrate including:
a first light-emitting layer interposed between a light-transmitting first electrode and a semi-transparent common electrode; and
a first light-reflecting layer arranged on a first side of the first electrode and the first light-emitting layer arranged on a second side of the first electrode opposite to the first side of the first electrode,
the first light-reflecting layer and the common electrode configuring an optical resonator structure that resonates a light emitted from the first light-emitting layer; and
a second light-emitting element over the substrate including:
a second light-emitting layer interposed between a light-transmitting second electrode and the semi-transparent common electrode; and
a second light-reflecting layer arranged on a first side of the second electrode and the second light-emitting layer arranged on a second side of the second electrode opposite to the first side of the second electrode,
the second light-reflecting layer and the common electrode configuring an optical resonator structure that resonates a light emitted from the second light-emitting layer,
the first light-emitting element and the second light-emitting element having respectively different resonance wavelengths to be resonated in the optical resonator structure,
an optical length (L) between the first light-reflecting layer and the common electrode in a direction of a normal line of the substrate satisfies the following relationship, $L > \lambda(m - \phi/2\pi)/2$ Wherein,
$\phi$ is a phase shift generated when the light emitted from the first light-emitting layer is reflected from the first electrode or the common electrode,
$\lambda$ is a peak wavelength of a spectrum of light which is to be extracted from among light emitted from the first light-emitting layer, and
m is integer number, and
an optical length (L') between the second light-reflecting layer and the common electrode in the direction of the normal line of the substrate satisfies the following relationship, $L' \cong \lambda'(m - \phi'/2\pi)/2$ Wherein,
$\phi'$ is a phase shift generated when the light emitted from the second light-emitting layer is reflected from the second electrode or the common electrode, and
$\lambda'$ is a peak wavelength of a spectrum of light which is to be extracted from among light emitted from the second light-emitting layer.

2. The light-emitting apparatus according to claim 1, wherein the optical length of the first light-emitting element emitting a red light between the first light-reflecting layer and the common electrode is set to be longer than a condition which provides an optimal resonance wavelength in the direction of the normal line of the substrate.

3. The light-emitting apparatus according to claim 1, wherein the optical length of the first light-emitting element emitting a green light between the first light-reflecting layer and the common electrode is set to be longer than the condition which provides an optimal resonance wavelength in the direction of the normal line of the substrate.

4. The light-emitting apparatus according to claim 1, wherein the resonance wavelength of the first or second light-emitting element is adjusted by a film thickness of the first electrode or the second electrode, respectively.

5. The light-emitting apparatus according to claim 1, wherein, a colored layer which transmits a light having a wavelength corresponding to the resonance wavelength of the first or second light-emitting element is arranged on the opposite side from the first light-emitting layer or the second light-emitting layer with the intermediary of the common electrode.

6. An electronic apparatus comprising the light-emitting apparatus according to claim 1.

* * * * *